United States Patent
Ishikawa

(10) Patent No.: US 7,835,220 B2
(45) Date of Patent: Nov. 16, 2010

(54) PLL CIRCUIT FOR INCREASING POTENTIAL DIFFERENCE BETWEEN GROUND VOLTAGE AND REFERENCE VOLTAGE OR POWER SOURCE VOLTAGE OF OSCILLATION CIRCUIT

(75) Inventor: Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 460 days.

(21) Appl. No.: 12/033,657

(22) Filed: Feb. 19, 2008

(65) Prior Publication Data
US 2008/0291770 A1 Nov. 27, 2008

(30) Foreign Application Priority Data
Feb. 22, 2007 (JP) .............................. 2007-042229

(51) Int. Cl.
*G11C 8/18* (2006.01)
(52) U.S. Cl. ................................ 365/233.1; 365/233.11
(58) Field of Classification Search .............. 365/233.1, 365/233.11, 233.12; 327/156, 157, 148
See application file for complete search history.

(56) References Cited

U.S. PATENT DOCUMENTS 6,667,663 B2 * 12/2003 Ozawa ......................... 331/17
2003/0011437 A1 * 1/2003 Ozawa ........................... 331/2
2004/0239386 A1 * 12/2004 Lim et al. .................... 327/156
2008/0191761 A1 * 8/2008 Ikeda et al. .................. 327/157

FOREIGN PATENT DOCUMENTS

JP  H8-130465 A  5/1996

* cited by examiner

*Primary Examiner*—Vu A Le
(74) *Attorney, Agent, or Firm*—Sughrue Mion, PLLC

(57) ABSTRACT

A PLL circuit includes a phase comparator for outputting a frequency control signal based on a result of comparison between phases of an input reference clock signal and a fed-back oscillation signal; an oscillation circuit, connected to the phase comparator, for outputting an oscillation signal having a frequency in accordance with the frequency control signal, a power source voltage, and a predetermined reference voltage; and a bias control circuit, connected to the oscillation circuit, for increasing either the potential difference between the reference voltage of the oscillation circuit and a ground voltage or the potential difference between the power source voltage of the oscillation circuit and the ground voltage. A transistor in the oscillation circuit can operate in a saturation area, thereby operating the PLL circuit at a high speed with a low power source voltage, without being easily affected by a variation in the temperature or other process conditions.

13 Claims, 14 Drawing Sheets

PLL CIRCUIT FOR INCREASING POTENTIAL DIFFERENCE BETWEEN GROUND VOLTAGE AND REFERENCE VOLTAGE OR POWER SOURCE VOLTAGE OF OSCILLATION CIRCUIT

BACKGROUND OF THE INVENTION

1. Field of the Invention

The present invention relates to a technique for operating a PLL (phase-locked loop) circuit at a high speed with a low power source voltage.

Priority is claimed on Japanese Patent Application No. 2007-042229, filed Feb. 22, 2007, the contents of which are incorporated herein by reference.

2. Description of the Related Art

The PLL circuit has a function of multiplying the frequency of a clock signal, controlling the skew with respect to a clock signal, or the like, and thus is an important circuit used in a semiconductor integrated circuit or an electronic device. With the advance of a low power source voltage and a high-speed operation of recent electronic devices, the PLL circuit should also operate with a low power source voltage and at a high speed.

For example, such a low power source voltage and a high-speed operation have been possible with respect to a DRAM (dynamic random access memory), which causes a reduction of the margin provided for the operation of a PLL circuit, which is included in the DRAM so as to control the relevant parts of the DRAM.

As a PLL circuit coping with such a low power source voltage, Japanese Unexamined Patent Application, First Publication No. H08-130465 discloses a PLL circuit having a wide control-voltage range with respect to a charge pump circuit.

Generally, the charge pump circuit is a main circuit which restricts the low power source voltage and the high-speed operation.

FIG. 13 is a circuit diagram showing a charge pump circuit and a loop filter which are generally used in a PLL circuit. In a charge pump circuit 1100, a control voltage Vcont is (i) increased by outputting a current Iup to a loop filter 103 in accordance with an increase signal "UP" (i.e., signal for designating an increase in the control voltage), and (ii) decreased by receiving a current Idown from the loop filter 103 in accordance with a decrease signal "DOWN".

Additionally, in the PLL circuit, a voltage-controlled oscillator (VCO) is connected to the control voltage Vcont so that the oscillation frequency of the VCO is controlled by the control voltage Vcont. Generally, in such a VCO, the higher the control voltage Vcont, the higher the oscillation frequency.

That is, the control voltage Vcont should be high so as to obtain a high oscillation frequency of the VCO. However, as a result, the voltage between the drain and the source (i.e., drain-source voltage Vds) of a PMOS transistor 1101, which forms the charge pump circuit 1100, should be low.

The operation of the charge pump circuit 11 in this process will be explained with reference to FIG. 14, which shows the dependency of the outflow current Iup (which flows by means of the PMOS transistor 1101) and the inflow current Idown (which flows by means of an NMOS transistor 1102) on the control voltage Vcont. As shown in FIG. 14, when the control voltage Vcont increases, the operating point of the PMOS transistor 1101 may shift from the point B, which belongs to a saturation area, to the point A, which belongs to a linear area (i.e., area 1200 which is close to the power source voltage VDD).

In the vicinity of the point B, when the control voltage Vcont varies, a small variation occurs in the outflow current Iup and the inflow current Idown. In contrast, in the vicinity of the point A, when the control voltage Vcont varies, there is a considerable variation in the outflow current Iup.

That is, in order that the VCO oscillates at a constant frequency, the control voltage Vcont varies depending on a variation in the temperature or other conditions with regard to the relevant processes, and the outflow current Iup considerably varies in accordance with the variation in the control voltage Vcont, thereby increasing the difference between the outflow current Iup and the inflow current Idown.

On the other hand, when decreasing the power source voltage VDD, the drain-source voltage Vds of the PMOS transistor 1101 (which forms the charge pump circuit) also decreases, similar to the above process. As a result, the PMOS transistor 1101 operates at the point A which belongs to the linear area, which also causes the above-described problem.

That is, when decreasing the power source voltage VDD by increasing the oscillation frequency of the PLL circuit, there occurs a difference between the values of the outflow current Iup and the inflow current Idown. In addition, there occurs a large variation in the outflow current Iup in accordance with a variation in the temperature or other process conditions. Therefore, even when the PLL circuit is locked, there occurs a phase difference between the signals output from the relevant phase comparator (i.e., the signals UP and DOWN), which causes a drift in the oscillation frequency of the VCO (i.e., depending on a variation in the temperature or other process conditions).

SUMMARY OF THE INVENTION

In light of the above circumstances, an object of the present invention is to provide a PLL circuit, which operates with a low power source voltage and at a high speed without being easily affected by a variation in the temperature or other process conditions.

Therefore, the present invention provides a PLL circuit comprising:

a phase comparator for outputting a frequency control signal based on a result of comparison between phases of an input reference clock signal and a fed-back oscillation signal;

an oscillation circuit, connected to the phase comparator, for outputting an oscillation signal having a frequency in accordance with the frequency control signal output from the phase comparator, a power source voltage, and a predetermined reference voltage; and a bias control circuit, connected to the oscillation circuit, for increasing either the potential difference between the reference voltage of the oscillation circuit and a ground voltage or the potential difference between the power source voltage of the oscillation circuit and the ground voltage.

In accordance with the above structure, either the potential difference between the reference voltage of the oscillation circuit and a ground voltage or the potential difference between the power source voltage of the oscillation circuit and the ground voltage can be increased so that a transistor provided in the oscillation circuit can operate in a saturation area, thereby operating the PLL circuit at a high speed with a low power source voltage, without being easily affected by a variation in the temperature or other process conditions.

In a first typical example:
the oscillation circuit includes:
a charge pump circuit into which the frequency control signal is input;
a loop filter into which a current in accordance with the frequency control signal and the power source voltage is input from the charge pump circuit, so as to output a control voltage; and
a voltage-controlled oscillator for outputting the oscillation signal having an oscillation frequency in accordance with the potential difference between the reference voltage and the control voltage output from the loop filter; and
the bias control circuit inputs the reference voltage into the voltage-controlled oscillator via a reference-voltage terminal thereof, where the input reference voltage is lower than the ground voltage.

In this case, as the reference voltage of the voltage-controlled oscillator is a negative voltage, the control voltage can be decreased, so that a (PMOS) transistor in the charge pump circuit for outputting the relevant current can operate in a saturation area. Accordingly, the outflow current and the inflow current with respect to the charge pump circuit can be almost identical to each other, thereby operating the PLL circuit at a high speed with a low power source voltage, without being easily affected by a variation in the temperature or other process conditions.

In a second typical example:
the oscillation circuit includes:
a charge pump circuit into which the frequency control signal is input;
a loop filter into which a current in accordance with the frequency control signal and the power source voltage is input from the charge pump circuit, so as to output a control voltage; and
a voltage-controlled oscillator for outputting the oscillation signal having an oscillation frequency in accordance with the potential difference between the reference voltage and the control voltage output from the loop filter; and
the bias control circuit inputs the power source voltage into the charge pump circuit via a power source voltage terminal thereof, where the input power source voltage is higher than an original power source voltage.

In this case, as the power source voltage input into the power source voltage terminal of the charge pump circuit is higher than the original power source voltage (i.e., supplied to structural elements other than the charge pump circuit in the PLL circuit) supplied from the power source, a (PMOS) transistor in the charge pump circuit for outputting the relevant current can operate in a saturation area. Accordingly, the outflow current and the inflow current with respect to the charge pump circuit can be almost identical to each other, thereby operating the PLL circuit at a high speed with a low power source voltage, without being easily affected by a variation in the temperature or other process conditions.

In a preferable example of the first typical example, the bias control circuit is a negative-voltage generating circuit for inputting a negative voltage as the reference voltage input into the reference-voltage terminal of the voltage-controlled oscillator.

In a preferable example of the second typical example, the bias control circuit is a booster circuit for inputting a voltage obtained by boosting the original power source voltage, into the power source voltage terminal of the charge pump circuit.

In another preferable example of the first typical example,:
the bias control circuit includes:
a negative-voltage generating circuit for generating a negative voltage; and
a first voltage control circuit for receiving the negative voltage via an input terminal thereof, changing the value of the negative voltage in accordance with a control signal input via a control terminal thereof, and inputting the changed negative voltage as the reference voltage into the reference-voltage terminal of the voltage-controlled oscillator.

In this case, as the value of the negative voltage can be controlled, the reference voltage of the voltage-controlled oscillator can have an appropriate value in accordance with the oscillation frequency.

In another preferable example of the second typical example,:
the bias control circuit includes:
a booster circuit for boosting the original power source voltage; and
a second voltage control circuit for receiving the boosted power source voltage via an input terminal thereof, changing the value of the power source voltage in accordance with a control signal input via a control terminal thereof, and inputting the changed power source voltage into the power source voltage terminal of the charge pump circuit.

In this case, as the voltage higher than the original power source voltage can be controlled, the voltage for driving the charge pump circuit can have an appropriate value.

It is possible that the first voltage control circuit includes:
a first NMOS transistor whose gate and drain are connected to the control terminal;
a second NMOS transistor whose gate and drain are connected to the source of the first NMOS transistor;
a third NMOS transistor whose gate and drain are connected to the source of the second NMOS transistor, and whose source is connected to an output terminal used for outputting a signal to the voltage-controlled oscillator;
a fourth NMOS transistor whose drain is connected to the output terminal, and whose source is connected to the negative-voltage generating circuit; and
an amplifier, one input terminal of which is connected to the source of the second NMOS transistor and the gate and drain of the third NMOS transistor, and the other input terminal of which is grounded, wherein the output terminal of the amplifier is connected to the gate of the fourth NMOS transistor.

It is possible that the second voltage control circuit includes:
a first PMOS transistor whose source is connected to the booster circuit, and whose drain is connected to an output terminal used for outputting a signal to the charge pump circuit; and
an amplifier, one input terminal of which is connected to the control terminal, and the other input terminal is connected to the output terminal, wherein the output terminal of the amplifier is connected to the gate of the first PMOS transistor.

In another preferable example of the first typical example:
the voltage-controlled oscillator includes:
a first PMOS transistor, a second PMOS transistor, and a third PMOS transistor, whose sources are connected to an input terminal used for receiving the control voltage from the loop filter; and
a first NMOS transistor, a second NMOS transistor, and a third NMOS transistor, whose sources are connected to the reference-voltage terminal;

the drains of the first PMOS transistor and the first NMOS transistor are connected to the gates of the second PMOS transistor and the second NMOS transistor;

the drains of the second PMOS transistor and the second NMOS transistor are connected to the gates of the third PMOS transistor and the third NMOS transistor;

the drains of the third PMOS transistor and the third NMOS transistor are connected to an output terminal used for outputting the oscillation signal; and the gates of the first PMOS transistor and the first NMOS transistor are connected to the output terminal.

In another preferable example of the second typical example:

the frequency control signal is one of an increase signal for increasing the frequency of the oscillation signal and a decrease signal for decreasing the frequency of the oscillation signal;

the charge pump circuit includes:
a first PMOS transistor and a second PMOS transistor, whose sources are connected to the power source voltage terminal, and whose gates are connected to a bias voltage terminal into which a bias voltage is input;
a third PMOS transistor, whose source is connected to the drain of the second PMOS transistor, wherein the increase signal is input into the gate of the third PMOS transistor,
a first NMOS transistor, whose drain and gate are connected to the drain of the first PMOS transistor, wherein the source of the first NMOS transistor is grounded;
a second NMOS transistor in which the decrease is input into the gate thereof, and the drain of the second NMOS transistor is connected to the drain of the third PMOS transistor; and
a third NMOS transistor, whose source is grounded, and whose drain and gate are respectively connected to the source of the second NMOS transistor and the gate of the first NMOS transistor; and the drains of the third PMOS transistor and the second NMOS transistor are connected to an output terminal used for outputting a signal to the loop filter.

The present invention also provides a DRAM comprising:
a phase comparator for outputting a frequency control signal based on a result of comparison between phases of an input reference clock signal and a fed-back oscillation signal;
a charge pump circuit into which the frequency control signal is input;
a loop filter into which a current in accordance with the frequency control signal and the power source voltage is input from the charge pump circuit, so as to output a control voltage;
a voltage-controlled oscillator for outputting the oscillation signal having an oscillation frequency in accordance with the potential difference between the reference voltage and the control voltage output from the loop filter;
a negative-voltage generating part for generating a back bias voltage which is a negative voltage; and
a first voltage control circuit for receiving the back bias voltage via an input terminal thereof, changing the value of the back bias voltage in accordance with a control signal input via a control terminal thereof, and inputting the changed back bias voltage as the reference voltage into the voltage-controlled oscillator.

In accordance with the above structure, the negative voltage (i.e., the back bias voltage) of the DRAM is used as the reference voltage of the voltage-controlled oscillator. Therefore, the control voltage can be decreased, so that a (PMOS) transistor for outputting the current in the charge pump circuit can operate in a saturation area, without adding another specific circuit. Accordingly, the outflow current and the inflow current with respect to the charge pump circuit can be almost identical to each other, thereby operating the PLL circuit at a high speed with a low power source voltage, without being easily affected by a variation in the temperature or other process conditions.

The present invention also provides a DRAM comprising:
a phase comparator for outputting a frequency control signal based on a result of comparison between phases of an input reference clock signal and a fed-back oscillation signal;
a charge pump circuit into which the frequency control signal is input;
a loop filter into which a current in accordance with the frequency control signal and the power source voltage is input from the charge pump circuit, so as to output a control voltage;
a voltage-controlled oscillator for outputting the oscillation signal having an oscillation frequency in accordance with the potential difference between the reference voltage and the control voltage output from the loop filter;
a high-voltage generating part for outputting a word-line voltage higher than an original power source voltage; and
a second voltage control circuit for receiving the word-line voltage via an input terminal thereof, changing the value of the word-line voltage in accordance with a control signal input via a control terminal thereof, and inputting the changed word-line voltage into the charge pump circuit.

In accordance with the above structure, the charge pump circuit is driven by a voltage (i.e., the word-line voltage) higher than the voltage used for driving other circuits included in the DRAM, so that a (PMOS) transistor for outputting the current in the charge pump circuit can operate in a saturation area, without adding another specific circuit. Accordingly, the outflow current and the inflow current with respect to the charge pump circuit can be almost identical to each other, thereby operating the PLL circuit at a high speed with a low power source voltage, without being easily affected by a variation in the temperature or other process conditions.

DETAILED DESCRIPTION OF THE INVENTION

Hereinafter, embodiments of the present invention will be described with reference to the appended figures.

First Embodiment

A first embodiment of the present invention will be explained with reference to FIGS. 1 to 3.

Figure 1:
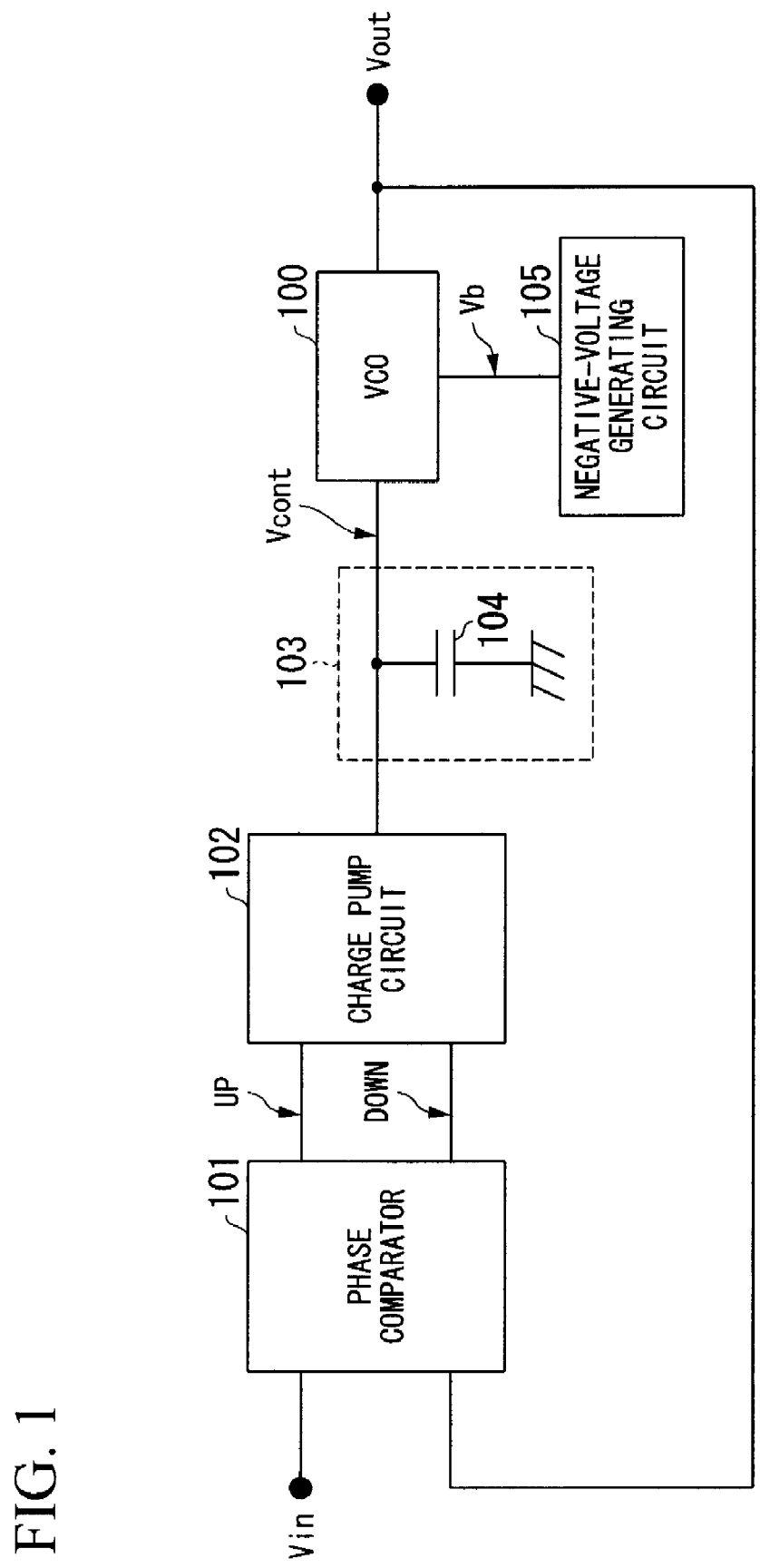
FIG. 1 is a diagram showing the structure of a PLL circuit as a first embodiment of the present invention.

FIG. 1 is a diagram showing the structure of a PLL circuit as the first embodiment of the present invention. The present PLL circuit is of a charge pump type.

In FIG. 1, reference numeral 100 indicates a voltage-controlled oscillator (i.e., VCO), reference numeral 101 indicates a phase comparator, reference numeral 102 indicates a charge pump circuit, reference numeral 103 indicates a loop filter, reference numeral 104 indicates a capacitor (or capacitance) which forms the loop filter 103, and reference numeral 105 indicates a negative-voltage generating circuit.

To the phase comparator 101, a reference clock signal Vin and a fed-back oscillation signal are input, where the latter is an oscillation signal Vout of the VCO 100, which is fed back. The increase signal UP and the decrease signal DOWN output from the phase comparator 101 are each input into the charge pump circuit 102, as a frequency control signal used for controlling the oscillation frequency of a signal output from the VCO 100. In addition, the output (i.e., for outputting the control voltage Vcont) of the charge pump circuit 102 is connected to one end of the capacitor 104 which forms the loop filter 103, and the control voltage Vcont is also input into the VCO 100. The other end of the capacitor 104 is grounded. Additionally, the signal (i.e., negative voltage Vb) output from the negative-voltage generating circuit 105 is input as the reference voltage into the VCO 100.

The operation of the present PLL circuit will be explained below. First, the phase comparator 101 compares the phases of the reference clock signal and the fed-back oscillation signal, which are input into the pair of the inputs of the phase comparator 101. Based on the result of the comparison, the phase comparator 101 outputs the increase signal UP or the decrease signal DOWN. For example, (i) when the frequency of the fed-back oscillation signal is lower than that of the reference clock signal, the phase comparator 101 outputs the increase signal UP, and (ii) when the frequency of the fed-back oscillation signal is higher than that of the reference clock signal, the phase comparator 101 outputs the decrease signal DOWN.

Next, based on the increase signal UP or the decrease signal DOWN, the charge pump circuit 102 outputs or receives the relevant current.

The loop filter 103 converts the current output from the charge pump circuit 102 into the control voltage Vcont, and also performs a filtering process. The VCO 100 generates an oscillation signal Vout in accordance with the control voltage Vcont, and outputs the signal, not only to the outside thereof, but also to the phase comparator 101 as the fed-back oscillation signal. The PLL circuit repeatedly performs the above-described operation, so as to output the oscillation signal Vout having a desired frequency which is locked.

The negative-voltage generating circuit 105 generates the negative voltage Vb which is lower than the ground voltage. The negative voltage Vb is input as a reference voltage from the reference-voltage terminal of the VCO 100. Accordingly, the oscillation frequency of the VCO 100 is determined in accordance with the difference between the negative voltage Vb and the control voltage Vcont.

Figure 2:
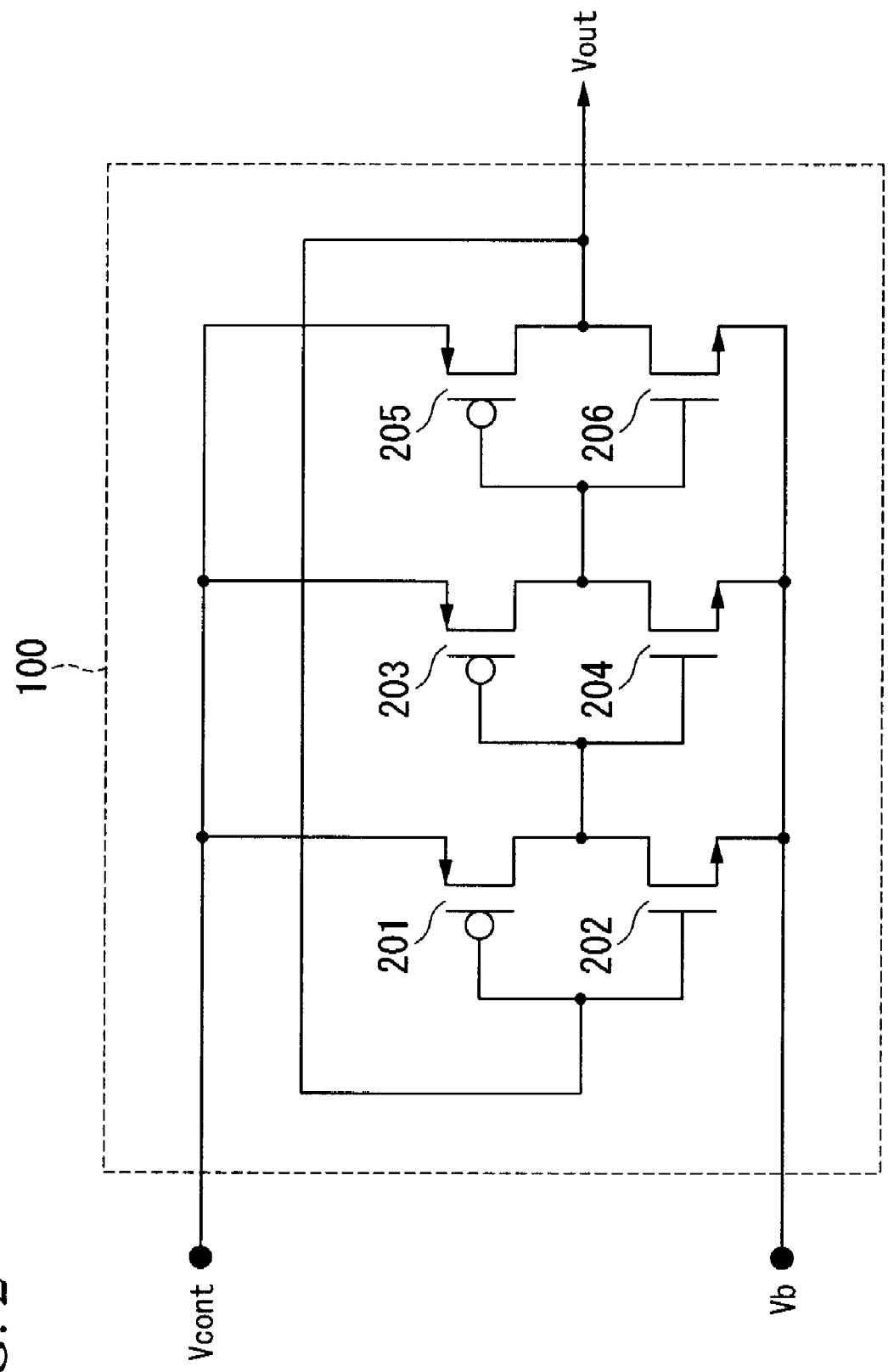
FIG. 2 is a circuit diagram showing the VCO of the first embodiment.

A concrete example of the VCO 100 will be shown with reference to FIG. 2. That is, FIG. 2 is a circuit diagram showing the VCO 100 of the first embodiment.

In FIG. 2, reference numerals 201, 203, and 205 indicate PMOS transistors, and reference numerals 202, 204, and 206 indicate NMOS transistors.

With respect to the PMOS transistor 201 and the NMOS transistor 202, the gates are connected to each other, and the drains are also connected to each other.

With respect to the PMOS transistor 203 and the NMOS transistor 204, the drains are connected to each other, and the gates are also connected to each other, which are also connected to the drains of the PMOS transistor 201 and the NMOS transistor 202.

With respect to the PMOS transistor 205 and the NMOS transistor 206, the gates are connected to each other, and are also connected to the drains of the PMOS transistor 203 and the NMOS transistor 204. In addition, the drains of the PMOS transistor 205 and the NMOS transistor 206 are connected to each other, and they output the oscillation signal Vout. They are also connected to the gates of the PMOS transistor 201 and the NMOS transistor 202.

The sources of the PMOS transistors 201, 203, and 205 are connected to each other, and the control voltage Vcont is input into the sources. In addition, the sources of the NMOS transistors 202, 204, and 206 are connected to each other, and are also connected to the reference-voltage terminal, to which the negative voltage Vb is input as the reference voltage.

As described above, the negative voltage Vb is generated using the negative-voltage generating circuit 105, and is input as the reference voltage of the VCO 100, thereby decreasing the control voltage Vcont by the negative voltage Vb, without changing the oscillation frequency.

For example, if the oscillation frequency of the VCO 100 is 1.6 GHz when the reference voltage is 0 V and the control voltage Vcont is 1.2 V, then by using the negative voltage Vb which is −0.5 V as the reference voltage, the oscillation frequency of the VCO 100 becomes 1.6 GHz when the control voltage Vcont is approximately 0.7 V.

Figure 3:
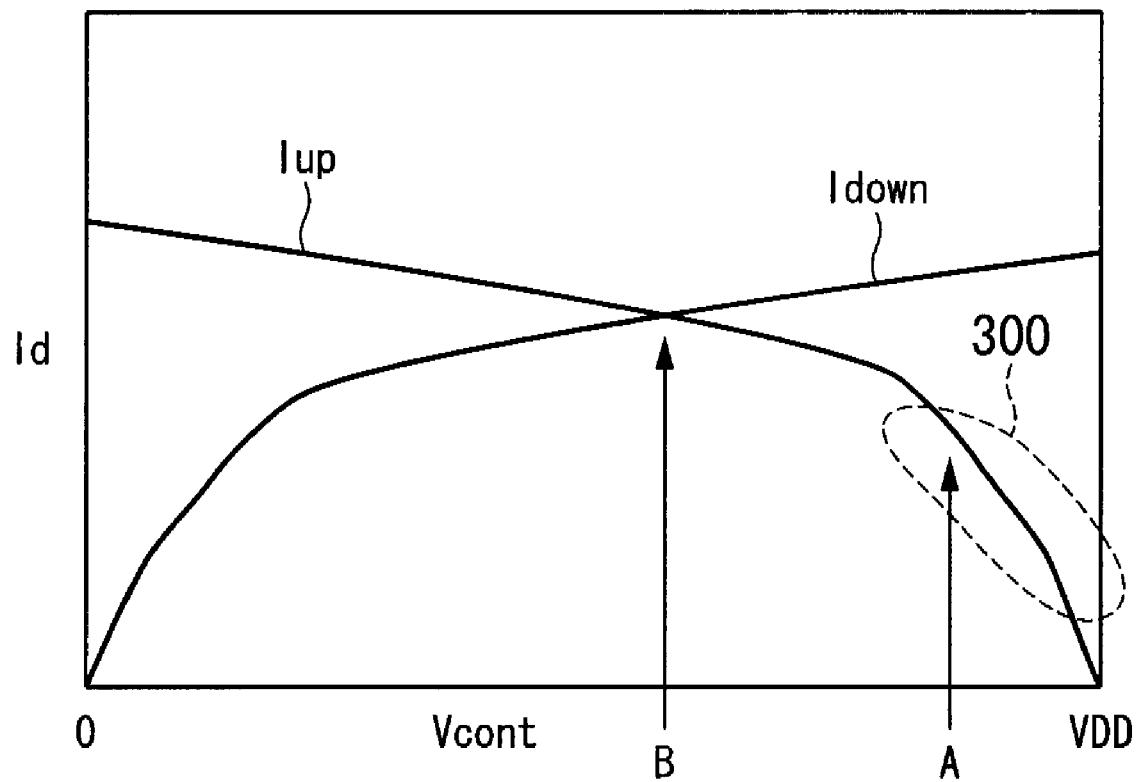
FIG. 3 is a graph showing the relationship between the charge pump current and the control voltage Vcont of the PLL circuit in the first embodiment.

FIG. 3 is a graph showing the relationship between the charge pump current and the control voltage Vcont of the PLL circuit. As shown in FIG. 3, when the reference voltage of the VCO 100 is 0 V, the control voltage Vcont is present at the point A. However, when using the negative voltage Vb as the reference voltage, the control voltage Vcont shifts to the point B, thereby avoiding a linear area 300, and also setting the outflow current Iup and the inflow current Idown to almost identical values.

That is, using the negative-voltage generating circuit 105 makes the transistor, by which the charge pump circuit 102 outputs the outflow current, operate in a saturation area.

Second Embodiment

Figure 4:
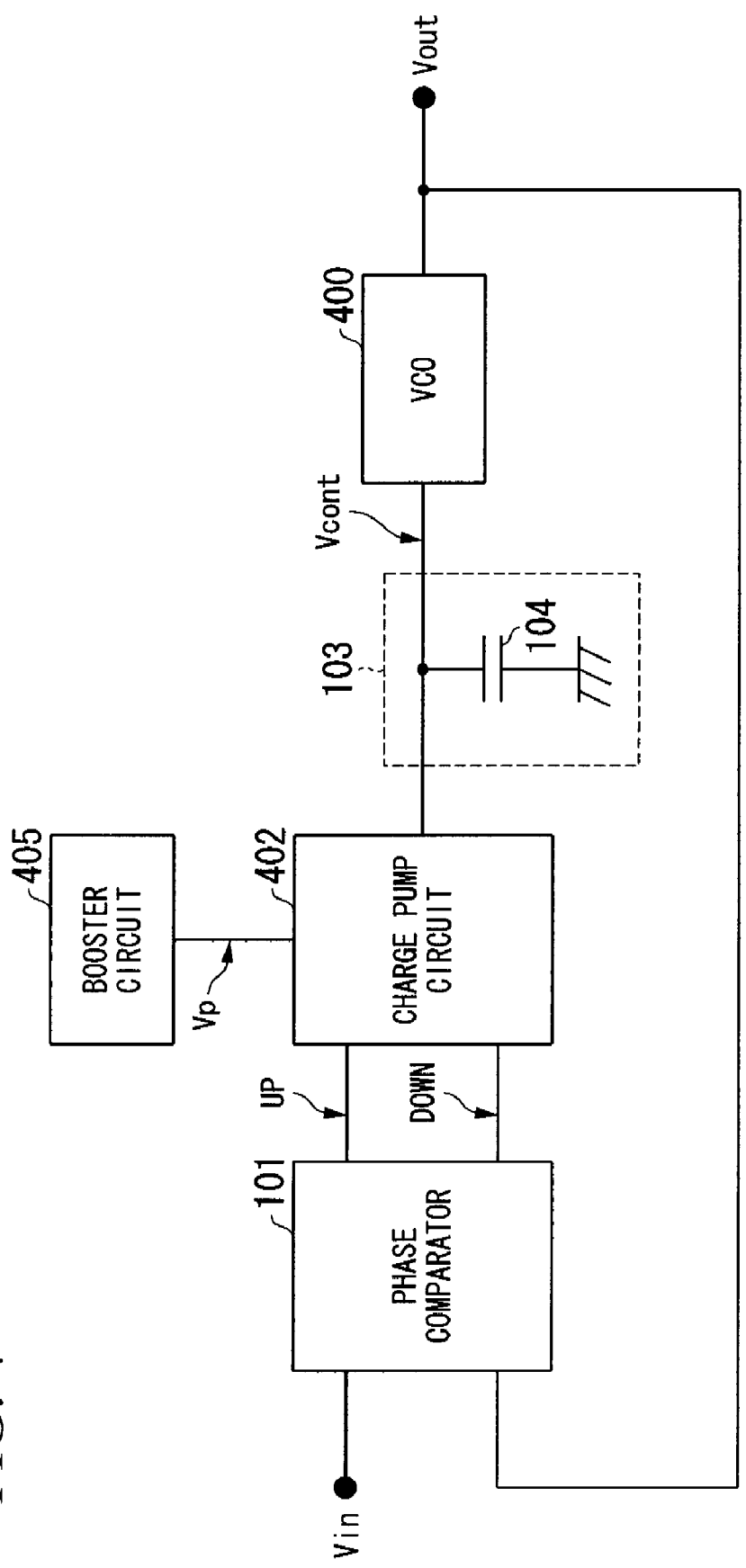
FIG. 4 is a diagram showing the structure of a PLL circuit as a second embodiment of the present invention.

A second embodiment of the present invention will be explained with reference to FIGS. 4 to 6. FIG. 4 is a diagram showing the structure of a PLL circuit of the present embodiment. The present PLL circuit is also of the charge pump type.

In FIG. 4, reference numeral 400 indicates a VCO, reference numeral 402 indicates a charge pump circuit, and reference numeral 405 indicates a booster circuit. The other structural elements are identical to the corresponding elements in FIG. 1, and explanations thereof are omitted here.

To the phase comparator 101, the reference clock signal Vin and a fed-back oscillation signal are input, where the latter is an oscillation signal Vout of the VCO 400, which is fed back. The increase signal UP and the decrease signal DOWN output from the phase comparator 101 are each input into the charge pump circuit 402. In addition, the output (i.e., for outputting the control voltage Vcont) of the charge pump circuit 402 is connected to one end of the capacitor 104 which forms the loop filter 103, and the control voltage Vcont is also input into the VCO 400. The other end of the capacitor 104 is grounded. Additionally, the signal (i.e., voltage Vp) output from the booster circuit 405 is input as the power source voltage into the source terminal of the charge pump circuit 402.

The basic operation of the present PLL circuit is identical to that of the first embodiment, and explanations thereof are omitted. Below, distinctive operations of the present embodiment will be described.

The booster circuit 405 generates the voltage Vp, which is higher than the power source voltage VDD supplied from a power source. The charge pump circuit 402 is driven by the voltage Vp generated by the booster circuit 405. That is, the charge pump circuit 402 operates by the power source voltage Vp (>VDD), and the structural elements other than the charge pump circuit 402 operate by the power source voltage VDD.

Figure 5:
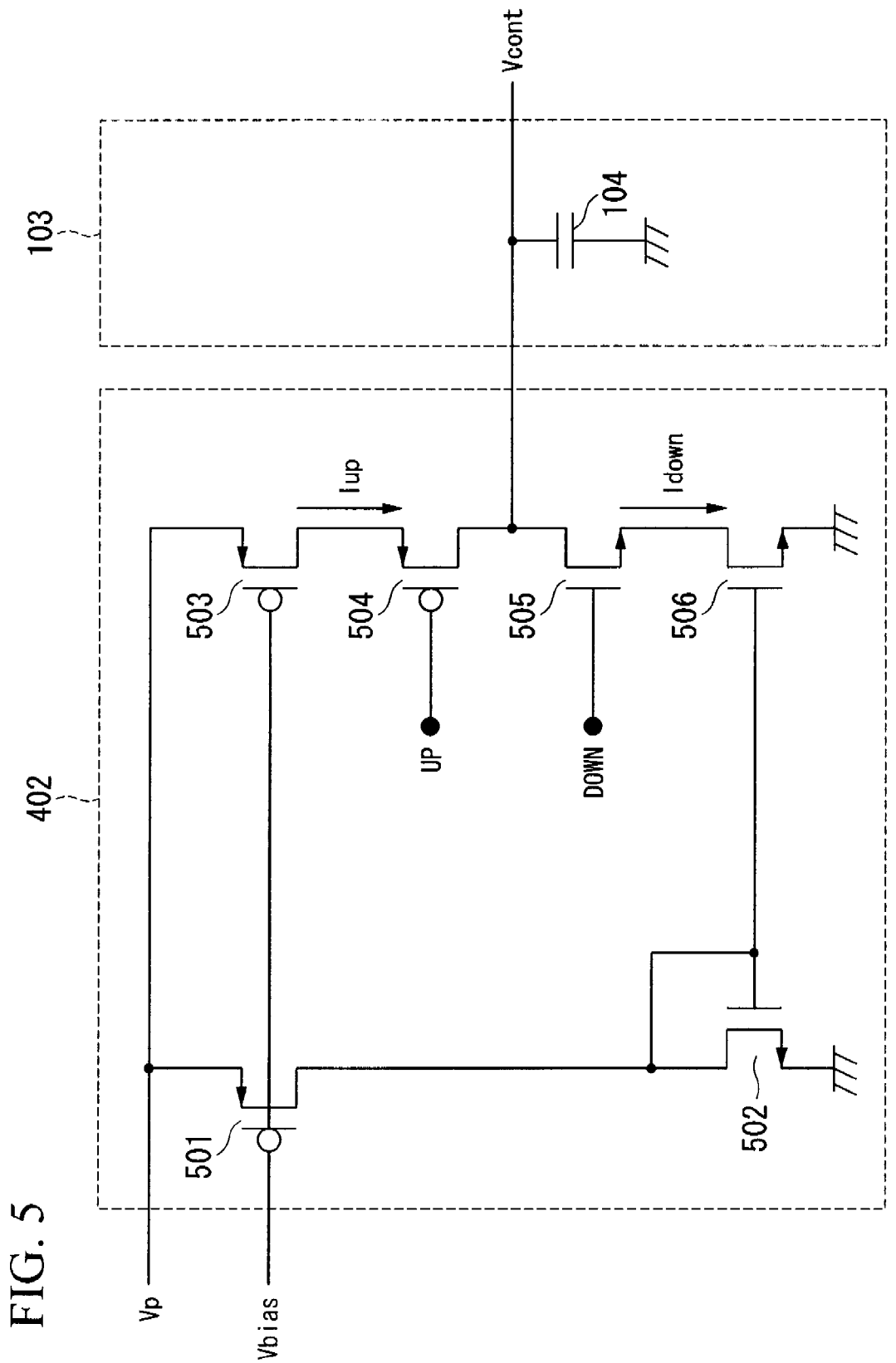
FIG. 5 is a circuit diagram showing the charge pump circuit and the loop filter of the second embodiment.

A concrete example of the charge pump circuit 402 will be shown with reference to FIG. 5. That is, FIG. 5 is a circuit diagram showing the charge pump circuit and the loop filter of the present embodiment.

In FIG. 5, reference numerals 501, 503, and 504 indicate PMOS transistors, and reference numerals 502, 505, and 506 indicate NMOS transistors. The other structural elements are identical to the corresponding elements in FIG. 4, and explanations thereof are omitted here.

With respect to the PMOS transistors 501 and 503, the sources are connected to each other, and the gates are also connected to each other, to which a bias voltage Vbias is input.

The drain of the PMOS transistor 501 is connected to the source of the NMOS transistor 502. The gate of the NMOS transistor 502 is connected to the drain thereof, and also connected to the gate of the NMOS transistor 506. The sources of the NMOS transistors 502 and 506 are each grounded.

The source of the PMOS transistor 504 is connected to the drain of the PMOS transistor 503, and the drain of the PMOS transistor 504 is connected to the drain of the NMOS transistor 505, which is also connected to the loop filter 103 (i.e., the control voltage Vcont). The increase signal UP is input into the gate of the PMOS transistor 504.

The source of the NMOS transistor 505 is connected to the drain of the NMOS transistor 506, and the decrease signal DOWN is input into the gate of the NMOS transistor 505.

The values of the outflow current Iup and the inflow current Idown are determined in accordance with the specific bias voltage Vbias.

In the present charge pump circuit 402, when the increase signal UP is input, the PMOS transistor 504 is switched on, so that the outflow current Iup is output to the loop filter 103 via the PMOS transistor 503. On the other hand, when the decrease signal DOWN is input, the NMOS transistor 505 is switched on, so that the inflow current Idown is drawn from the loop filter 103 via the NMOS transistor 506.

Accordingly, the charge pump circuit 402 controls the control voltage Vcont.

As described above, the voltage Vp, which is higher than the power source voltage VDD, is generated using the booster circuit 405, and it functions as the power source voltage used for driving the charge pump circuit 402. Therefore, it is possible to increase the drain-source voltage Vds of the PMOS transistor 503.

For example, if the drain-source voltage Vds of the PMOS transistor 503 is approximately 0.6 V when the power source voltage Vp and the control voltage Vcont of the charge pump circuit 402 are respectively 1.8 V and 1.2 V, then by setting the power source voltage Vp to 3 V, the drain-source voltage Vds of the PMOS transistor 503 becomes approximately 1.8 V.

Figure 6A:
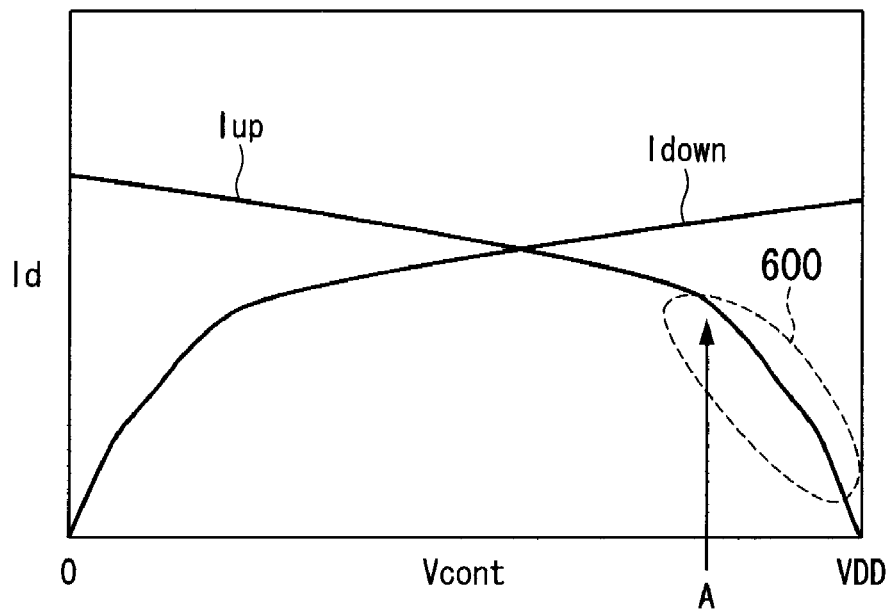
FIGS. 6A and 6B are graphs showing the relationship between the charge pump current and the control voltage Vcont of the PLL circuit in the second embodiment.
Figure 6B:
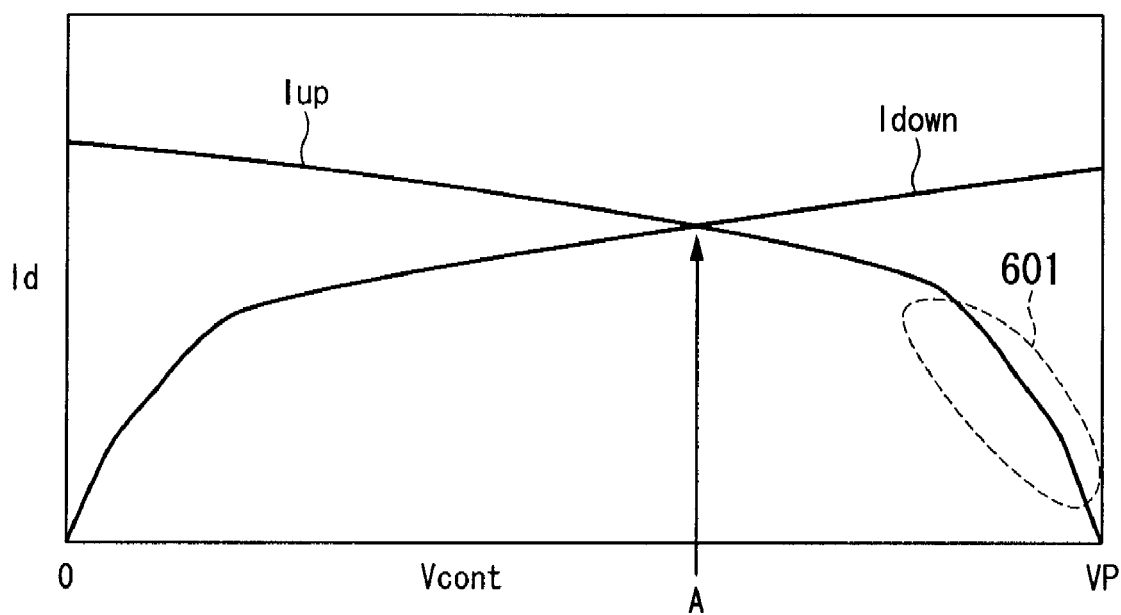

FIGS. 6A and 6B are graphs showing the relationships between the charge pump current and the control voltage Vcont of the present PLL circuit. As shown in FIG. 6A, when the power source voltage is VDD, the control voltage Vcont is present at the point A which belongs to a linear area 600, where there is a considerable difference between the outflow current Iup and the inflow current Idown. However, as shown in FIG. 6B, when the power source voltage is Vp which is larger than VDD, the control voltage Vcont is also present at the point A, but it is possible to avoid a linear area 601, and an area can be used where the outflow current Iup and the inflow current Idown are almost identical to each other.

That is, using the booster circuit 405 allows the PMOS transistor 503, by which the charge pump circuit 402 outputs the outflow current, to operate in a saturation area.

When a circuit consisting of the charge pump circuit 102, the loop filter 103, and the VCO 100 of the first embodiment and a circuit consisting of the charge pump circuit 402 , the loop filter 103, and the VCO 400 are each regarded as an oscillation circuit, the negative-voltage generating circuit 105 of the first embodiment and the booster circuit 405 of the second embodiment each function as a bias control circuit for supplying a negative voltage or a voltage higher than the power source voltage to the oscillation circuit.

Third Embodiment

Figure 7:
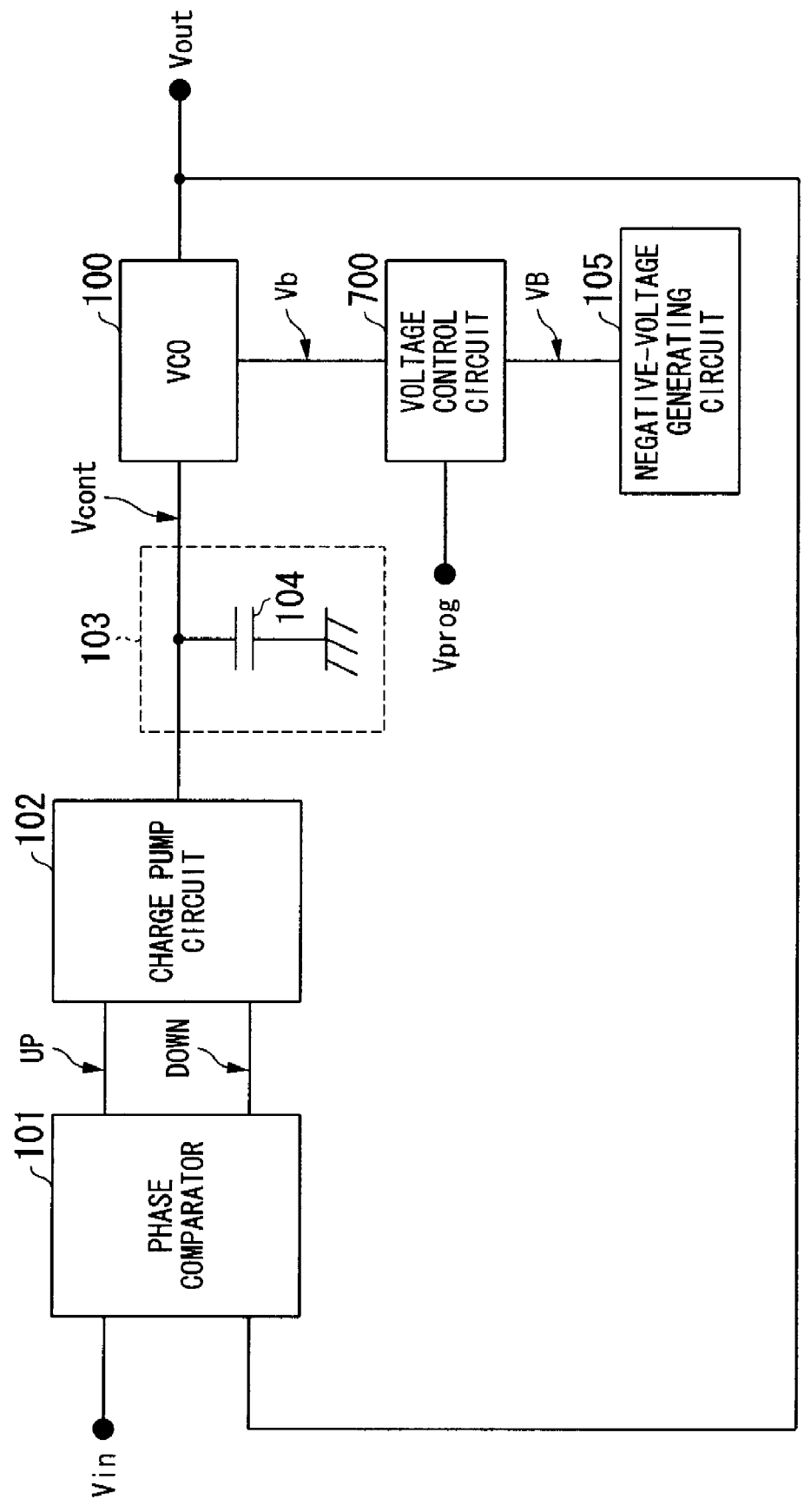
FIG. 7 is a diagram showing the structure of a PLL circuit as a third embodiment of the present invention.

A third embodiment of the present invention will be explained with reference to FIGS. 7 and 8. In FIG. 7, reference numeral 700 indicates a voltage control circuit (i.e., negative-voltage control part). The other structural elements are identical to the corresponding elements in FIG. 1, and explanations thereof are omitted here.

To the phase comparator 101, the reference clock signal Vin and the fed-back oscillation signal are input, where the latter is the oscillation signal Vout of the VCO 100, which is fed back. The increase signal UP and the decrease signal DOWN output from the phase comparator 10 are each input into the charge pump circuit 102. In addition, the output (i.e., for outputting the control voltage Vcont) of the charge pump circuit 102 is connected to one end of the capacitor 104 which forms the loop filter 103, and the control voltage Vcont is also input into the VCO 100. The other end of the capacitor 104 is grounded. Additionally, the signal (i.e., negative voltage VB) output from the negative-voltage generating circuit 105 is input into the voltage control circuit 700. In addition, the signal (i.e., negative voltage Vb) output from the voltage control circuit 700 is input as the reference voltage into the VCO 100. Furthermore, a programmable voltage Vprog is input into the voltage control circuit 700 via a control terminal thereof.

The present PLL circuit is also of the charge pump type.

The basic operation of the present PLL circuit is identical to that of the first embodiment, and explanations thereof are omitted. Below, distinctive operations of the present embodiment will be described.

The negative-voltage generating circuit 105 generates the negative voltage VB. The voltage control circuit 700 controls the negative voltage VB in accordance with the programmable voltage Vprog, so as to convert the negative voltage VB into the negative voltage Vb. The negative voltage Vb is input as the reference voltage into the VCO 100. Accordingly, the oscillation frequency of the VCO 100 is determined in accordance with the difference between the negative voltage Vb and the control voltage Vcont.

Figure 8:
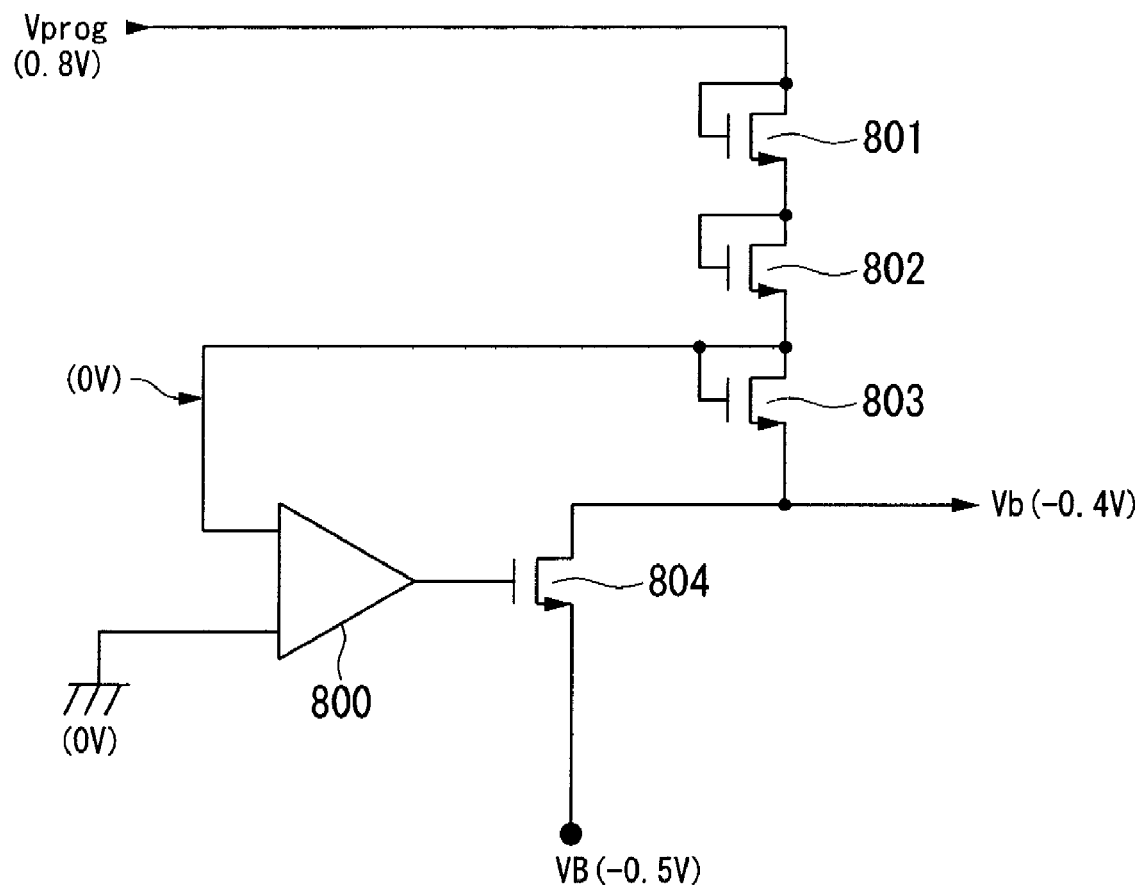
FIG. 8 is a circuit diagram showing the voltage control circuit of the third embodiment.

A concrete example of the voltage control circuit 700 will be shown with reference to FIG. 8. That is, FIG. 8 is a circuit diagram of the voltage control circuit 700.

In FIG. 8, reference numeral 800 indicates an amplifier, and reference numerals 801 to 804 indicate NMOS transistors.

The gate and the drain of the NMOS transistor 801 are connected to each other, and are also connected to the control terminal, into which the programmable voltage Vprog is input.

The gate and the drain of the NMOS transistor 802 are connected to each other, and are also connected to the source of the NMOS transistor 801.

The gate and the drain of the NMOS transistor 803 are connected to each other, and are also connected to the source of the NMOS transistor 802 and one of two input terminals of the amplifier 800.

The other input terminal of the amplifier 800 is grounded, and the output terminal thereof is connected to the gate of the NMOS transistor 804. The drain of the NMOS transistor 804 is connected to the source of the NMOS transistor 803, and also outputs the negative voltage Vb. In addition, the negative voltage VB is input into the source of the NMOS transistor 804.

In this example, the NMOS transistors 801 to 803 have the same transistor size.

The operation of the voltage control circuit 700 will be explained below. Here, it is assumed that the programmable voltage Vprog input from the control terminal is 0.8 V, and the negative voltage VB is −0.5 V. As the above-described other input terminal of the amplifier 800 is grounded, the above-described one input terminal thereof is 0 V. That is, the gate voltage and the drain voltage of the NMOS transistor 803 are each 0 V. Therefore, a current in accordance with the programmable voltage Vprog and the resistances of the NMOS transistors 801 and 802 flows through the NMOS transistors 801 to 803, and the current further flows through the NMOS transistor 804.

As the NMOS transistors 801 to 803 have the same transistor size, the voltage drop generated through the NMOS transistors 801 and 802 is 0.8 V, and the voltage drop generated through the NMOS transistor 803 is 0.4 V. That is, the negative voltage Vb is −0.4 V.

Similarly, the negative voltage Vb can be changed by changing the programmable voltage Vprog. For example, when the programmable voltage Vprog is 0.7 V, the negative voltage Vb is −0.35 V, and when the programmable voltage Vprog is 0.6 V, the negative voltage Vb becomes −0.3 V.

In accordance with the above-described circuit, the reference voltage of the VCO 100 can be programmably controlled and set to an appropriate value in accordance with the oscillation frequency.

That is, similar to the first embodiment, with reference to FIG. 3 which shows the relationship between the charge pump current and the control voltage Vcont, when the reference voltage of the VCO 100 is 0 V, the control voltage Vcont is present at the point A. However, when using the negative voltage Vb as the reference voltage, the control voltage Vcont shifts to the point B, so that the linear area 300 can be avoided, and an area can be used where the outflow current Iup and the inflow current Idown are almost identical to each other.

That is, using the negative-voltage generating circuit 105 and the voltage control circuit 700 allows the transistor, by which the charge pump circuit 102 outputs the outflow current, to operate in a saturation area. Here, the first voltage control circuit of the present invention corresponds to the voltage control circuit 700. In addition, the NMOS transistors 801 to 803 may have different transistor sizes.

Fourth Embodiment

Figure 9:
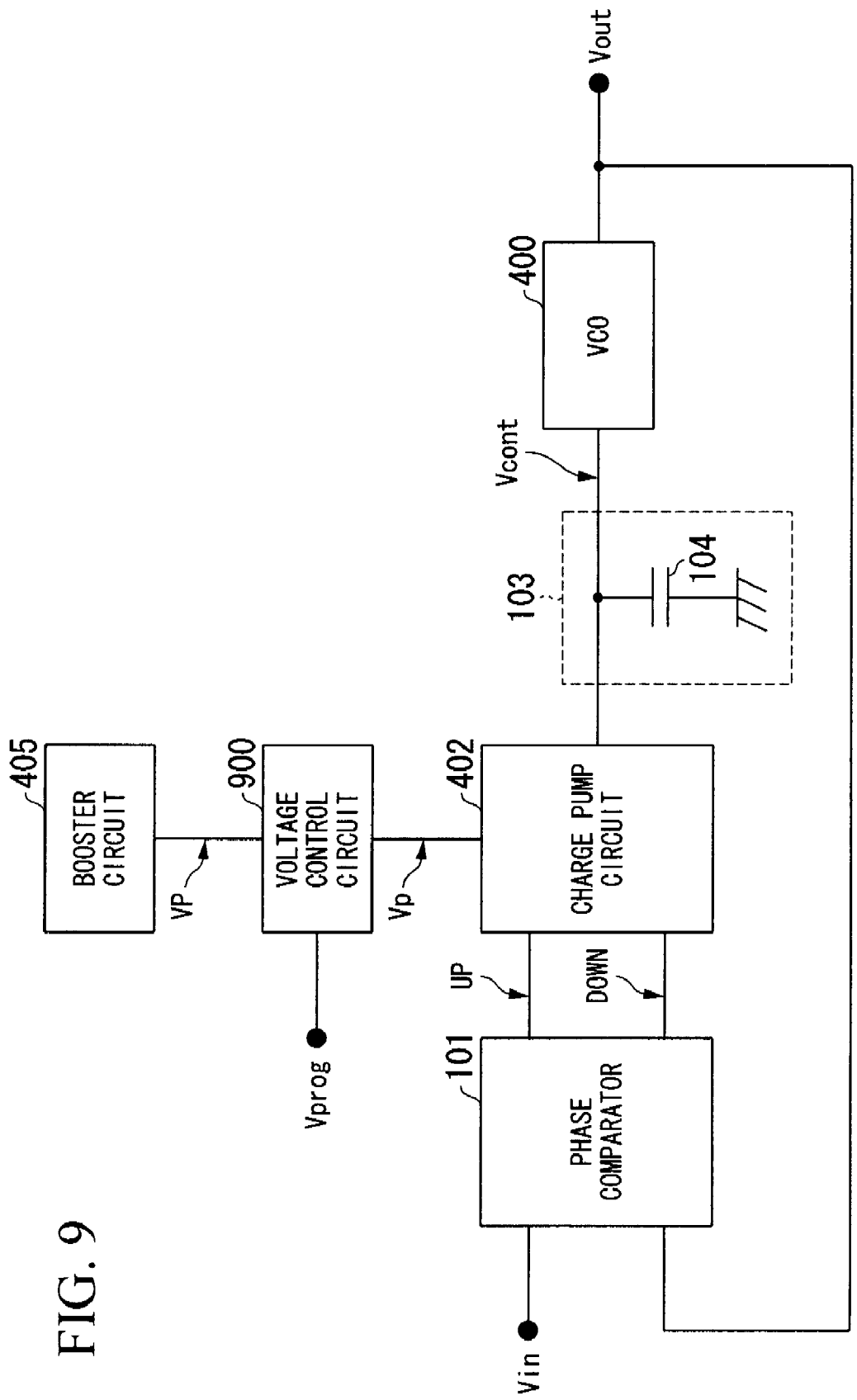
FIG. 9 is a diagram showing the structure of a PLL circuit as a fourth embodiment of the present invention.

A fourth embodiment of the present invention will be explained with reference to FIGS. 9 and 10. FIG. 4 is a diagram showing the structure of a PLL circuit of the present embodiment. In FIG. 4, reference numeral 900 indicates a voltage control circuit (i.e., voltage control part). The other structural elements are identical to the corresponding elements in FIG. 4, and explanations thereof are omitted here.

To the phase comparator 101, the reference clock signal Vin and the fed-back oscillation signal are input, where the latter is the oscillation signal Vout of the VCO 400, which is fed back. The increase signal UP and the decrease signal DOWN output from the phase comparator 101 are each input into the charge pump circuit 402. In addition, the output (i.e., for outputting the control voltage Vcont) of the charge pump circuit 402 is connected to the one end of the capacitor 104 which forms the loop filter 103, and the control voltage Vcont is also input into the VCO 400. The other end of the capacitor 104 is grounded. Additionally, the signal (i.e., voltage VP) output from the booster circuit 405 is input into the voltage control circuit 900. The signal (i.e., voltage Vp) output from the voltage control circuit 900 is input as the power source voltage into the charge pump circuit 402. Furthermore, a programmable voltage Vprog is input into the voltage control circuit 900 via a control terminal thereof.

The present PLL circuit is also of the charge pump type.

The basic operation of the present PLL circuit is identical to that of the first embodiment, and explanations thereof are omitted. Below, distinctive operations of the present embodiment will be described.

The booster circuit 405 generates the voltage VP, which is higher than the power source voltage VDD. The voltage control circuit 900 controls the voltage VP in accordance with the programmable voltage Vprog, so as to convert the voltage VP into the voltage Vp. The charge pump circuit 402 is driven by the voltage Vp output from the voltage control circuit 900. That is, the charge pump circuit 402 operates by the power source voltage Vp (>VDD), and the elements other than the charge pump circuit 402 operate by the power source voltage VDD.

Figure 10:
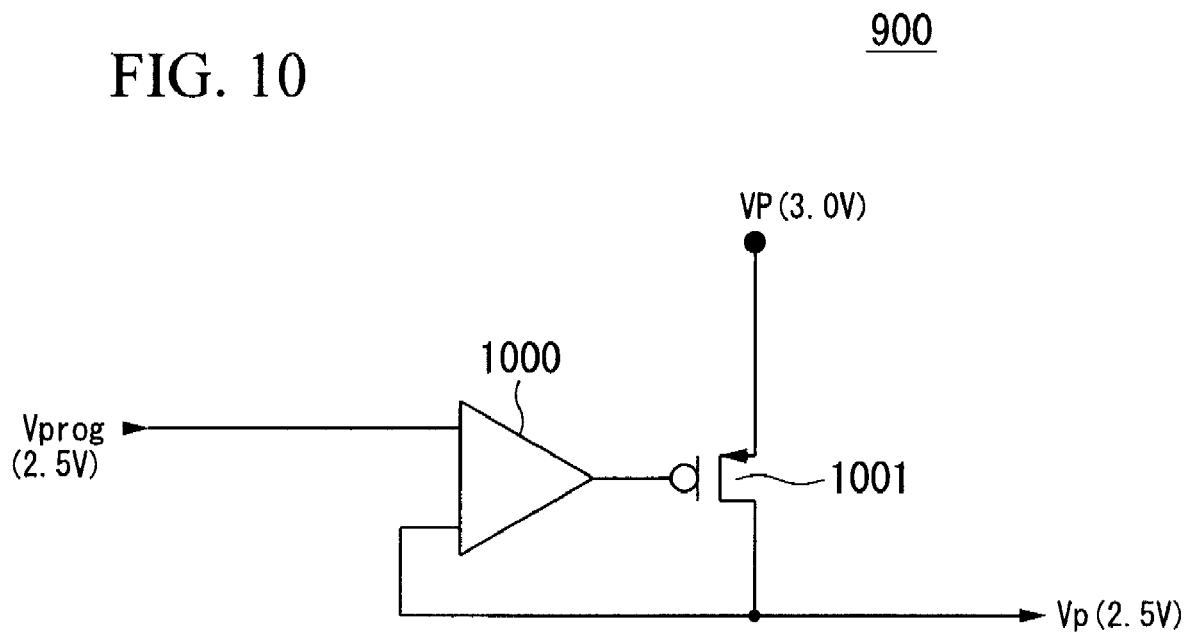
FIG. 10 is a circuit diagram showing the voltage control circuit of the fourth embodiment.

A concrete example of the voltage control circuit 900 will be shown with reference to FIG. 10. That is, FIG. 10 is a circuit diagram of the voltage control circuit 900.

In FIG. 10, reference numeral 1000 indicates an amplifier, and reference numeral 1001 indicates a PMOS transistor.

One input terminal of the amplifier 1000 functions as the control terminal of the voltage control circuit 900, and the programmable voltage Vprog is input into this control terminal. The other input terminal of the amplifier 1000 is connected to the drain of the PMOS transistor 1001, and is also used for outputting the voltage Vp. The output terminal of the amplifier 1000 is connected to the gate of the PMOS transistor 1001. In addition, the voltage VP is input into the source of the PMOS transistor 1001.

Next, the operation of the voltage control circuit 900 will be explained. First, it is assumed that the programmable voltage Vprog is 2.5 V, and the voltage VP is 3.0 V. As the programmable voltage Vprog (2.5V) is input into the above-described one input terminal of the amplifier 1000, the voltage Vp at the other input terminal of the amplifier 1000 is also 2.5 V.

Similarly, the voltage Vp can be changed by changing the programmable voltage Vprog. For example, when the programmable voltage Vprog is 2.8 V, the voltage Vp is also 2.8 V. That is, in the present circuit, the power source voltage of the charge pump circuit 402 can be programmably controlled.

Therefore, similar to the second embodiment, in the present embodiment, the linear area 601 (see FIG. 6B) can be avoided as indicated by the point A, and an area can be used where the outflow current Iup and the inflow current Idown are almost identical to each other.

That is, using the booster circuit 405 and the voltage control circuit 900 allows the PMOS transistor 503, by which the charge pump circuit 402 outputs the outflow current, to operate in a saturation area. In addition, the second voltage control circuit of the present invention corresponds to the voltage control circuit 900.

Fifth Embodiment

A fifth embodiment of the present invention will be explained with reference to FIG. 11. The present embodiment relates to a PLL circuit which is included in a DRAM.

Figure 11:
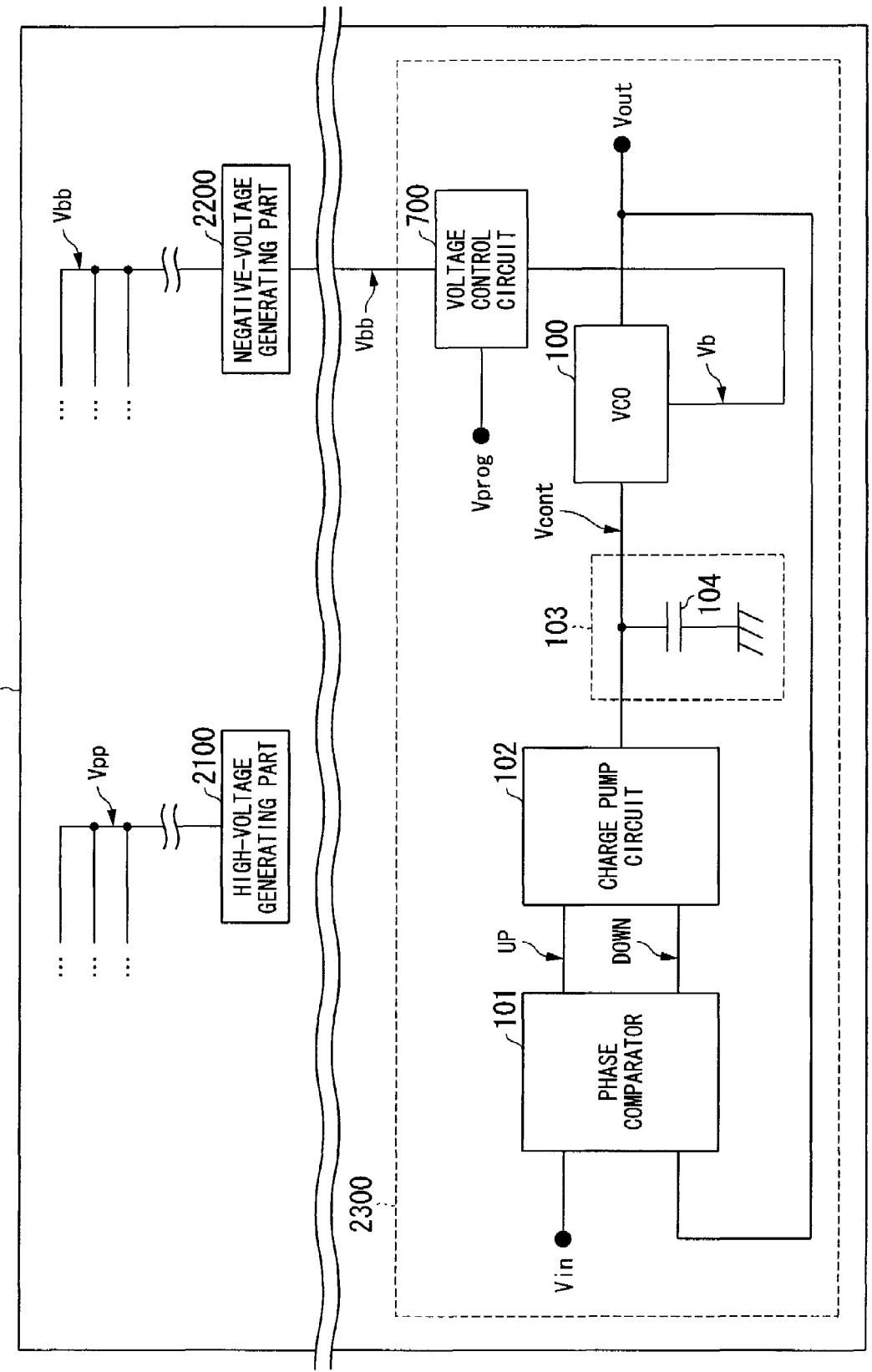
FIG. 11 is a block diagram showing a DRAM and a PLL circuit included in the DRAM of a fifth embodiment of the present invention.

FIG. 11 is a block diagram showing the DRAM and the PLL circuit included in the DRAM of the fifth embodiment.

In FIG. 11, reference numeral 2000 indicates the DRAM, reference numeral 2100 indicates a high-voltage generating part 2100, reference numeral 2200 indicates a negative-voltage generating part, and reference numeral 2300 indicates the PLL circuit. The other structural elements are identical to the corresponding elements in FIG. 7, and explanations thereof are omitted here. In addition, in the DRAM 2000, structural elements other than those shown in FIG. 11 are not shown in the figure.

The DRAM 2000 includes the PLL circuit 2300 used for controlling each part in the DRAM. The PLL circuit 2300 has a structure in which the negative-voltage generating circuit 105 is excluded from the PLL circuit of the third embodiment.

The DRAM 2000 also includes the negative-voltage generating part 2200 for generating a back bias voltage Vbb which is a negative voltage, and the high-voltage generating part 2100 for generating a word-line voltage Vpp which is higher than the power source voltage VDD. As generally known, the back bias voltage Vbb and the word-line voltage Vpp are voltages used for operations such as writing, reading, and deletion of data with respect to the DRAM 2000. For example, regarding a DRAM which operates with the power source voltage VDD of 1.8 V, the back bias voltage Vbb is −0.5 V, and the word-line voltage Vpp is 3 V.

As described in the third embodiment, the PLL circuit in accordance with the present invention can be implemented by inputting the back bias voltage Vbb into the voltage control circuit 700, thereby omitting the negative-voltage generating circuit 105. That is, the reference voltage of the VCO 100 is the negative voltage provided by the DRAM 2000 which is controlled by the PLL circuit 2300.

Similar to the first embodiment, in accordance with the structure of the fifth embodiment, when the reference voltage of the VCO 100 is 0 V, the control voltage Vcont is present at the point A (see FIG. 3). However, when using the negative voltage Vb as the reference voltage, the control voltage Vcont shifts to the point B, thereby avoiding the linear area 300, and also setting the outflow current Iup and the inflow current Idown to almost identical values.

Additionally, similar to the first embodiment, the back bias voltage Vbb may be directly applied as the reference voltage of the VCO 100, without using the voltage control circuit 700.

Sixth Embodiment

A sixth embodiment of the present invention will be explained with reference to FIG. 12. The present embodiment also relates to a PLL circuit which is included in a DRAM.

Figure 12:
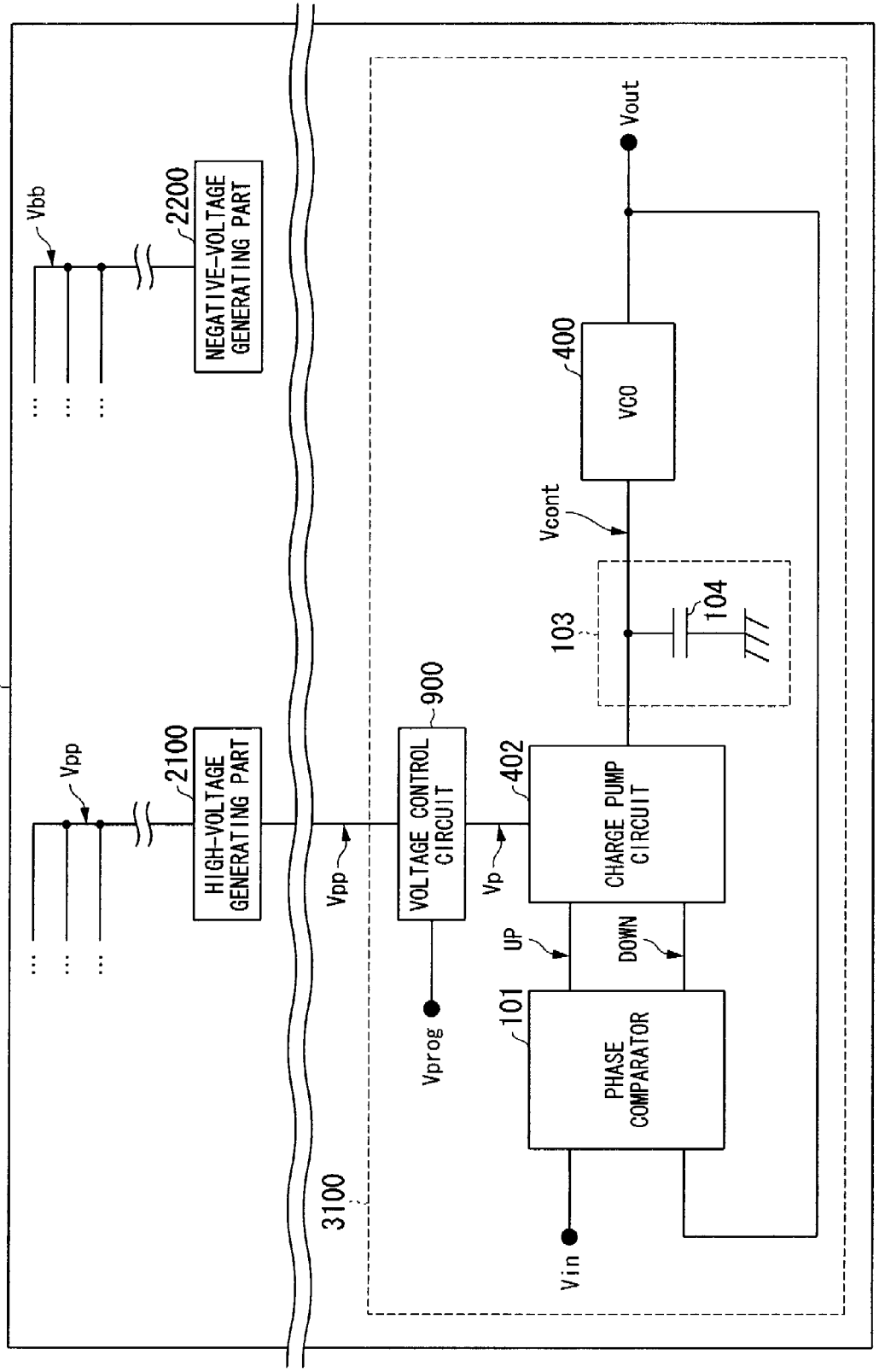
FIG. 12 is a block diagram showing a DRAM and a PLL circuit included in the DRAM of a sixth embodiment of the present invention.
Figure 13:
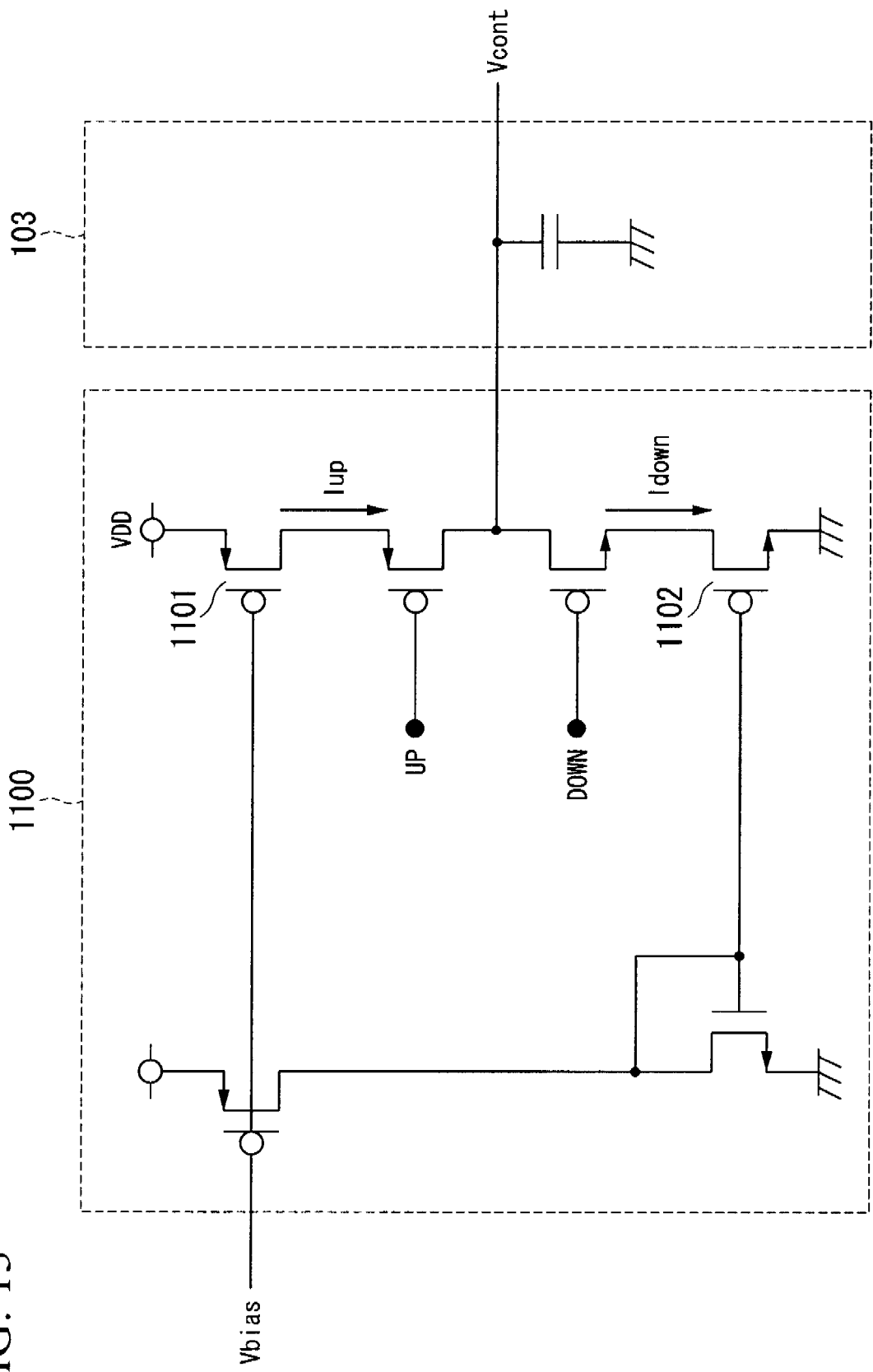
FIG. 13 is a circuit diagram showing a charge pump circuit and a loop filter which are generally used in a conventional PLL circuit.
Figure 14:
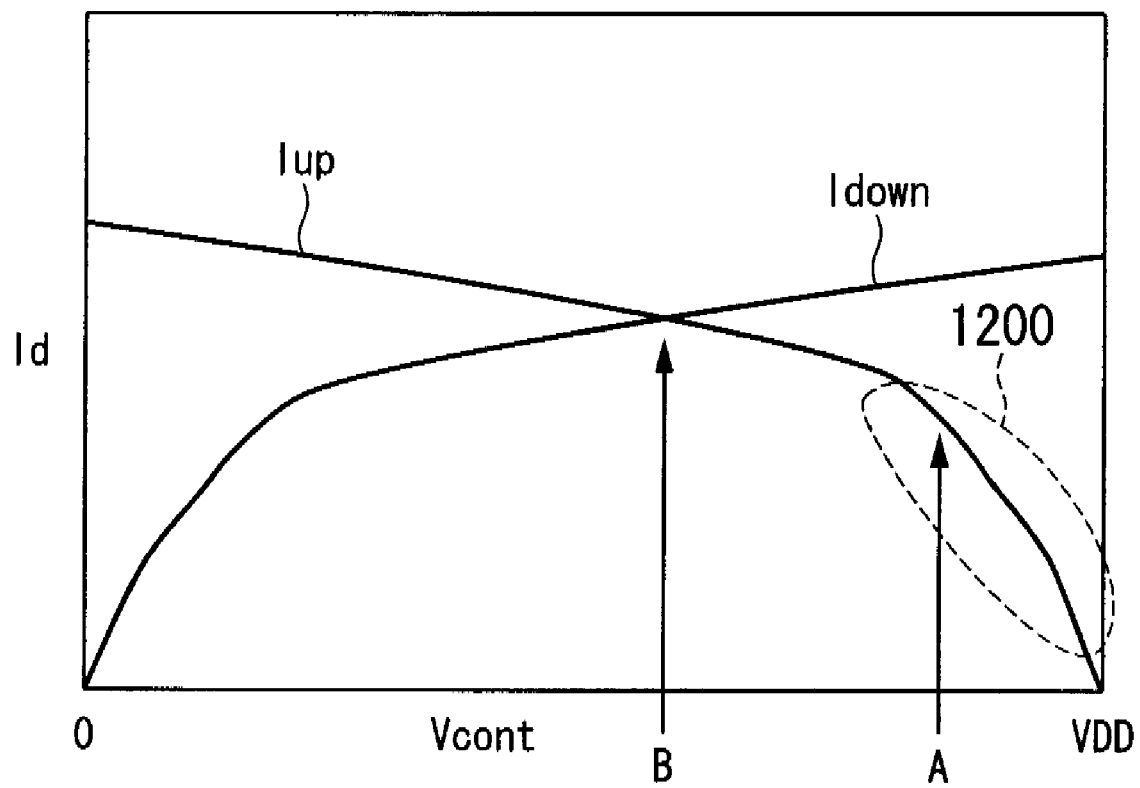
FIG. 14 is a diagram showing the dependency of the outflow current Iup and the inflow current Idown on the control voltage Vcont, with respect to the charge pump circuit in FIG. 13.

FIG. 12 is a block diagram showing the DRAM and the PLL circuit included in the DRAM of the sixth embodiment.

In FIG. 12, reference numeral 3000 indicates the DRAM, reference numeral 3100 indicates the PLL circuit. The other structural elements are identical to the corresponding elements in FIGS. 9 and 11, and explanations thereof are omitted here. In addition, in the DRAM 3000, structural elements other than those shown in FIG. 12 are not shown in the figure.

The DRAM 3000 includes the PLL circuit 3100 used for controlling each part in the DRAM. The PLL circuit 3100 has a structure in which the booster circuit 405 is excluded from the PLL circuit of the fourth embodiment. In addition, similar to the fifth embodiment, the DRAM 3000 also includes the negative-voltage generating part 2200 for generating the back bias voltage Vbb which is a negative voltage, and a high-voltage generating part 2100 for generating the word-line voltage Vpp which is higher than the power source voltage VDD.

In the present embodiment, the PLL circuit in accordance with the present invention can be implemented by inputting the word-line voltage Vpp into the voltage control circuit 900, thereby omitting the booster circuit 405. That is, the charge pump circuit 402 is driven by a voltage higher than the power source voltage provided by the DRAM 3000 which is controlled by the PLL circuit 3100.

Similar to the second embodiment, in accordance with the structure of the sixth embodiment, as shown by the point A in FIG. 6B, the linear area 601 can be avoided, and the outflow current Iup and the inflow current Idown can be set to almost identical values.

Additionally, similar to the second embodiment, the word-line voltage Vpp may be directly applied as the power supply voltage of the charge pump circuit 402 without using the voltage control circuit 900, so that the charge pump circuit 402 is driven by the word-line voltage Vpp.

While preferred embodiments of the invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

For example, the VCO and the charge pump circuit may each have a structure other than those described above.

The structure of the PLL circuit is also not limited to those described above. For example, (i) the signal output from the VCO may be frequency-divided using a frequency divider, and then input into the phase comparator, or (ii) the reference clock signal may be frequency-divided using a frequency divider, and then input into the phase comparator.

In addition, the negative voltages Vb and VB, the voltages Vp and VP, the back bias voltage Vbb, and the word-line voltage Vpp are provided as examples, and another kind of voltage may be used.

Furthermore, the PLL circuit may simultaneously include some structural elements belonging to different embodiments described above.

The oscillation circuit of the present invention corresponds to (i) a circuit consisting of the charge pump circuit 102, the loop filter 103, and the VCO 100 in the first embodiment and the third embodiment, and (ii) a circuit consisting of the charge pump circuit 402, the loop filter 103, and the VCO 400 in the second embodiment and the fourth embodiment.

The bias control circuit of the present invention corresponds to (i) the negative-voltage generating circuit 105 in the first embodiment, (ii) the booster circuit 405 in the second embodiment, (iii) a circuit consisting of the voltage control circuit 700 (i.e., the first voltage control circuit) and the negative-voltage generating circuit 105 in the third embodiment, and (iv) a circuit consisting of the voltage control circuit 900 (i.e., the second voltage control circuit) and the booster circuit 405 in the fourth embodiment.

Additionally, in the voltage-controlled oscillator of the present invention, the first PMOS transistor corresponds to the PMOS transistor 201, the second PMOS transistor corresponds to the PMOS transistor 203, the third PMOS transistor corresponds to the PMOS transistor 205, the first NMOS transistor corresponds to the NMOS transistor 202, the second NMOS transistor corresponds to the NMOS transistor 204, and the third NMOS transistor corresponds to the NMOS transistor 206.

On the other hand, in the charge pump circuit of the present invention, the first PMOS transistor corresponds to the PMOS transistor 501, the second PMOS transistor corresponds to the PMOS transistor 503, the third PMOS transistor corresponds to the PMOS transistor 504, the first NMOS transistor corresponds to the NMOS transistor 502, the second NMOS transistor corresponds to the NMOS transistor 505, and the third NMOS transistor corresponds to the NMOS transistor 506.

Additionally, in the first voltage control circuit of the present invention, the first NMOS transistor corresponds to the NMOS transistor 801, the second NMOS transistor corresponds to the NMOS transistor 802, the third NMOS transistor corresponds to the NMOS transistor 803, the fourth NMOS transistor corresponds to the NMOS transistor 804, and the amplifier corresponds to the amplifier 800.

On the other hand, in the second voltage control circuit of the present invention, the first PMOS transistor corresponds to the PMOS transistor 1001, and the amplifier corresponds to the amplifier 1000.

What is claimed is:

1. A PLL circuit comprising:
a phase comparator for outputting a frequency control signal based on a result of comparison between phases of an input reference clock signal and a fed-back oscillation signal;
an oscillation circuit, connected to the phase comparator, for outputting an oscillation signal having a frequency in accordance with the frequency control signal output from the phase comparator, a power source voltage, and a predetermined reference voltage; and
a bias control circuit, connected to the oscillation circuit, for increasing either the potential difference between the reference voltage of the oscillation circuit and a ground voltage or the potential difference between the power source voltage of the oscillation circuit and the ground voltage.

2. The PLL circuit in accordance with claim 1, wherein:
the oscillation circuit includes:
a charge pump circuit into which the frequency control signal is input;
a loop filter into which a current in accordance with the frequency control signal and the power source voltage is input from the charge pump circuit, so as to output a control voltage; and
a voltage-controlled oscillator for outputting the oscillation signal having an oscillation frequency in accordance with the potential difference between the reference voltage and the control voltage output from the loop filter; and
the bias control circuit inputs the reference voltage into the voltage-controlled oscillator via a reference-voltage terminal thereof, where the input reference voltage is lower than the ground voltage.

3. The PLL circuit in accordance with claim 1, wherein:
the oscillation circuit includes:
a charge pump circuit into which the frequency control signal is input;
a loop filter into which a current in accordance with the frequency control signal and the power source voltage is input from the charge pump circuit, so as to output a control voltage; and
a voltage-controlled oscillator for outputting the oscillation signal having an oscillation frequency in accordance with the potential difference between the reference voltage and the control voltage output from the loop filter; and
the bias control circuit inputs the power source voltage into the charge pump circuit via a power source voltage terminal thereof, where the input power source voltage is higher than an original power source voltage.

4. The PLL circuit in accordance with claim 2, wherein:
the bias control circuit is a negative-voltage generating circuit for inputting a negative voltage as the reference voltage input into the reference-voltage terminal of the voltage-controlled oscillator.

5. The PLL circuit in accordance with claim 3, wherein:
the bias control circuit is a booster circuit for inputting a voltage obtained by boosting the original power source voltage, into the power source voltage terminal of the charge pump circuit.

6. The PLL circuit in accordance with claim 2, wherein:
the bias control circuit includes:
a negative-voltage generating circuit for generating a negative voltage; and
a first voltage control circuit for receiving the negative voltage via an input terminal thereof, changing the value of the negative voltage in accordance with a control signal input via a control terminal thereof, and inputting the changed negative voltage as the reference voltage into the reference-voltage terminal of the voltage-controlled oscillator.

7. The PLL circuit in accordance with claim 3, wherein:
the bias control circuit includes:
a booster circuit for boosting the original power source voltage; and
a second voltage control circuit for receiving the boosted power source voltage via an input terminal thereof, changing the value of the power source voltage in accordance with a control signal input via a control terminal thereof, and inputting the changed power source voltage into the power source voltage terminal of the charge pump circuit.

8. The PLL circuit in accordance with claim 6, wherein the first voltage control circuit includes:
a first NMOS transistor whose gate and drain are connected to the control terminal;
a second NMOS transistor whose gate and drain are connected to the source of the first NMOS transistor;
a third NMOS transistor whose gate and drain are connected to the source of the second NMOS transistor, and whose source is connected to an output terminal used for outputting a signal to the voltage-controlled oscillator;
a fourth NMOS transistor whose drain is connected to the output terminal, and whose source is connected to the negative-voltage generating circuit; and
an amplifier, one input terminal of which is connected to the source of the second NMOS transistor and the gate and drain of the third NMOS transistor, and the other input terminal of which is grounded, wherein the output terminal of the amplifier is connected to the gate of the fourth NMOS transistor.

9. The PLL circuit in accordance with claim 7, wherein the second voltage control circuit includes:
a first PMOS transistor whose source is connected to the booster circuit, and whose drain is connected to an output terminal used for outputting a signal to the charge pump circuit; and
an amplifier, one input terminal of which is connected to the control terminal, and the other input terminal is connected to the output terminal, wherein the output terminal of the amplifier is connected to the gate of the first PMOS transistor.

10. The PLL circuit in accordance with claim 2, wherein:
the voltage-controlled oscillator includes:
a first PMOS transistor, a second PMOS transistor, and a third PMOS transistor, whose sources are connected to an input terminal used for receiving the control voltage from the loop filter; and
a first NMOS transistor, a second NMOS transistor, and a third NMOS transistor, whose sources are connected to the reference-voltage terminal;
the drains of the first PMOS transistor and the first NMOS transistor are connected to the gates of the second PMOS transistor and the second NMOS transistor;
the drains of the second PMOS transistor and the second NMOS transistor are connected to the gates of the third PMOS transistor and the third NMOS transistor;
the drains of the third PMOS transistor and the third NMOS transistor are connected to an output terminal used for outputting the oscillation signal; and
the gates of the first PMOS transistor and the first NMOS transistor are connected to the output terminal.

11. The PLL circuit in accordance with claim 3, wherein:
the frequency control signal is one of an increase signal for increasing the frequency of the oscillation signal and a decrease signal for decreasing the frequency of the oscillation signal;
the charge pump circuit includes:
a first PMOS transistor and a second PMOS transistor, whose sources are connected to the power source voltage terminal, and whose gates are connected to a bias voltage terminal into which a bias voltage is input;
a third PMOS transistor, whose source is connected to the drain of the second PMOS transistor, wherein the increase signal is input into the gate of the third PMOS transistor,
a first NMOS transistor, whose drain and gate are connected to the drain of the first PMOS transistor, wherein the source of the first NMOS transistor is grounded;
a second NMOS transistor in which the decrease is input into the gate thereof, and the drain of the second NMOS transistor is connected to the drain of the third PMOS transistor; and
a third NMOS transistor, whose source is grounded, and whose drain and gate are respectively connected to the source of the second NMOS transistor and the gate of the first NMOS transistor; and
the drains of the third PMOS transistor and the second NMOS transistor are connected to an output terminal used for outputting a signal to the loop filter.

12. A DRAM comprising:
a phase comparator for outputting a frequency control signal based on a result of comparison between phases of an input reference clock signal and a fed-back oscillation signal;
a charge pump circuit into which the frequency control signal is input;
a loop filter into which a current in accordance with the frequency control signal and the power source voltage is input from the charge pump circuit, so as to output a control voltage;
a voltage-controlled oscillator for outputting the oscillation signal having an oscillation frequency in accordance with the potential difference between the reference voltage and the control voltage output from the loop filter;
a negative-voltage generating part for generating a back bias voltage which is a negative voltage; and
a first voltage control circuit for receiving the back bias voltage via an input terminal thereof, changing the value of the back bias voltage in accordance with a control signal input via a control terminal thereof, and inputting the changed back bias voltage as the reference voltage into the voltage-controlled oscillator.

13. A DRAM comprising:
a phase comparator for outputting a frequency control signal based on a result of comparison between phases of an input reference clock signal and a fed-back oscillation signal;
a charge pump circuit into which the frequency control signal is input;
a loop filter into which a current in accordance with the frequency control signal and the power source voltage is input from the charge pump circuit, so as to output a control voltage;
a voltage-controlled oscillator for outputting the oscillation signal having an oscillation frequency in accordance with the potential difference between the reference voltage and the control voltage output from the loop filter;

a high-voltage generating part for outputting a word-line voltage higher than an original power source voltage; and a second voltage control circuit for receiving the word-line voltage via an input terminal thereof, changing the value of the word-line voltage in accordance with a control signal input via a control terminal thereof, and inputting the changed word-line voltage into the charge pump circuit.

* * * * *